US008717134B2

(12) United States Patent
Pintgen et al.

(10) Patent No.: US 8,717,134 B2
(45) Date of Patent: May 6, 2014

(54) SYSTEM WITH DIRECTIONAL PRESSURE VENTING

(75) Inventors: Florian Peter Pintgen, Niskayuna, NY (US); Paul Alfred Siemers, Clifton Park, NY (US); Malcolm Graham Smith, Jr., Haughton, LA (US)

(73) Assignee: General Electric Company, Schenectady, NY (US)

( * ) Notice: Subject to any disclaimer, the term of this patent is extended or adjusted under 35 U.S.C. 154(b) by 901 days.

(21) Appl. No.: 12/212,062

(22) Filed: Sep. 17, 2008

(65) Prior Publication Data

US 2010/0065261 A1 Mar. 18, 2010

(51) Int. Cl.

| | |
|---|---|
| ***H01F 27/02*** | (2006.01) |
| ***H01F 27/08*** | (2006.01) |
| ***H01F 27/10*** | (2006.01) |
| ***H05K 5/00*** | (2006.01) |
| ***H05K 7/20*** | (2006.01) |
| ***H01B 3/24*** | (2006.01) |

(52) U.S. Cl.
USPC ................... 336/90; 336/55; 336/57; 336/58; 336/61; 336/92; 336/94; 174/17 VA; 174/17 LF; 252/570

(58) Field of Classification Search
USPC ........ 336/90, 55, 57, 58, 61, 92, 94; 220/721; 174/17 VA, 17 LF; 252/570
See application file for complete search history.

(56) References Cited

U.S. PATENT DOCUMENTS

| | | | | |
|---|---|---|---|---|
| 1,620,411 | A | 3/1927 | Temple | |
| 1,641,247 | A | 9/1927 | Bingay | |
| 1,780,319 | A | 11/1930 | Sonneborn | |
| 2,142,366 | A | 1/1939 | Mitschrich | |
| 2,773,146 | A | 12/1956 | Sauer | |
| 2,961,476 | A * | 11/1960 | Maslin et al. | 174/15.1 |
| 3,217,082 | A * | 11/1965 | King et al. | 174/11 R |
| 3,545,538 | A | 12/1970 | Hinnant | |
| 3,644,858 | A * | 2/1972 | Galloway | 336/92 |
| 3,921,112 | A | 11/1975 | Broverman | |
| 4,453,197 | A | 6/1984 | Burrage | |
| 4,745,966 | A | 5/1988 | Avery | |
| 4,775,849 | A * | 10/1988 | Lucas | 336/90 |
| 4,939,833 | A | 7/1990 | Thomas | |
| 6,522,229 | B2 | 2/2003 | Laine et al. | |
| 6,570,479 | B2 | 5/2003 | Colby | |
| 6,726,857 | B2 * | 4/2004 | Goedde et al. | 252/570 |
| 6,804,092 | B1 | 10/2004 | Magnier | |
| 2006/0201799 | A1 | 9/2006 | Carrasco-Aguirre | |
| 2007/0001793 | A1 | 1/2007 | Magnier | |

FOREIGN PATENT DOCUMENTS

| | | | |
|---|---|---|---|
| CN | 2063279 | | 10/1990 |
| CN | 2217259 | | 1/1996 |
| CN | 2886766 | Y * | 4/2007 |
| DE | 1 971 624 | U | 11/1967 |

(Continued)

OTHER PUBLICATIONS

Search report issued in connection with EP Application No. 09169978.5, May 2, 2013.

(Continued)

*Primary Examiner* — Tsz Chan
(74) *Attorney, Agent, or Firm* — Fletcher Yoder, P.C.

(57) ABSTRACT

A system comprises a tank, a radiator connected to the tank, and a component situated within the tank and susceptible to creating increasing pressure within system when under a fault condition. The radiator is configured to directionally vent pressure under excessive pressure conditions.

14 Claims, 5 Drawing Sheets

(56) References Cited

FOREIGN PATENT DOCUMENTS

| | | | | |
|---|---|---|---|---|
| DE | 1971624 | U1 | | 11/1967 |
| GB | 334127 | A | | 8/1930 |
| GB | 688952 | A | | 3/1953 |
| GB | 766331 | A | | 1/1957 |
| JP | 0061618 | C | | 1/1924 |
| JP | 37-022923 | Y | | 8/1962 |
| JP | 37-022924 | Y | | 8/1962 |
| JP | 39-026864 | B | | 11/1964 |
| JP | 59-000629 | Y2 | | 12/1980 |
| JP | 56056611 | A | | 5/1981 |
| JP | 57007909 | A | * | 1/1982 |
| JP | 57007911 | A | * | 1/1982 |
| JP | 59104108 | A1 | | 6/1984 |
| JP | H05211107 | A | | 8/1993 |
| KR | 754740 | B1 | * | 9/2007 |
| WO | 0163629 | A1 | | 8/2001 |

OTHER PUBLICATIONS

Office action issued in connection with CN patent application No. 200910175632.0, Apr. 23, 2013.

Non-Final Office Action Received from USPTO in Related Case U.S. App. No. 12/643,214, Dated Jun. 21, 2011.

Search Report issued in connection with CN Application No. 200910175632.0, Sep. 2, 2012.

Final Office Action received from the USPTO in related case U.S. Appl. No. 23/643,214, dated Oct. 31, 2011.

Office Action received from the USPTO regarding U.S. Appl. No. 12/212,050.

Office action issued in connection with JP Patent Application No. 2009-206545, Sep. 11, 2013.

* cited by examiner

SYSTEM WITH DIRECTIONAL PRESSURE VENTING

CROSS REFERENCE TO RELATED APPLICATIONS

This application is related to U.S. patent application Ser. No. 12/212,050, entitled "Rupture Resistant System", filed concurrently herewith, which is herein incorporated by reference.

BACKGROUND

The subject matter disclosed herein relates generally to transformers, and, more particularly, to a containment system for transformers that provides safer pressure relief under excessive pressure conditions.

Transformer failures result in sudden generation of gases and temperature increases, which increase pressure inside the transformer. Catastrophic rupture of a transformer may occur when the pressure generated exceeds the transformer's rupture pressure. Such ruptures may result in releasing gases and liquids, which can pose a hazard to the surroundings and pollute the environment.

It would be therefore desirable to prevent or at least mitigate damage from rupture of transformers.

BRIEF DESCRIPTION

In various embodiments disclosed herein, rupture is controlled by directionally venting the containment contents under excessive pressure conditions.

More specifically, in accordance with one embodiment disclosed herein, a system comprises a tank, a radiator connected to the tank, and a component situated within the tank and susceptible to causing a pressure increase in the system when under a fault condition. The radiator is configured to directionally vent gases and liquids under excessive pressure conditions.

In accordance with another embodiment disclosed herein, a transformer system comprises a transformer, a transformer tank housing the transformer, a radiator configured to directionally vent gases and liquids under excessive pressure conditions, and a header pipe connecting the radiator and the transformer tank.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In one embodiment, a system comprises a tank, a radiator connected to the tank, and a component situated within the tank and susceptible to causing a pressure increase in the system when under a fault condition. The radiator is configured to directionally vent gases and liquids under excessive pressure. In another embodiment, a system comprises a transformer, a transformer tank housing the transformer, a radiator configured to directionally vent gases and liquids under excessive pressure, and a header pipe connecting the radiator and the transformer tank. Although transformer embodiments are described for purposes of example, the embodiments described herein are useful for systems wherein undesired pressures may occur in a tank and/or radiator. As used herein, singular forms such as "a," "an," and "the" include single and plural referents unless the context clearly dictates otherwise.

Figure 1:
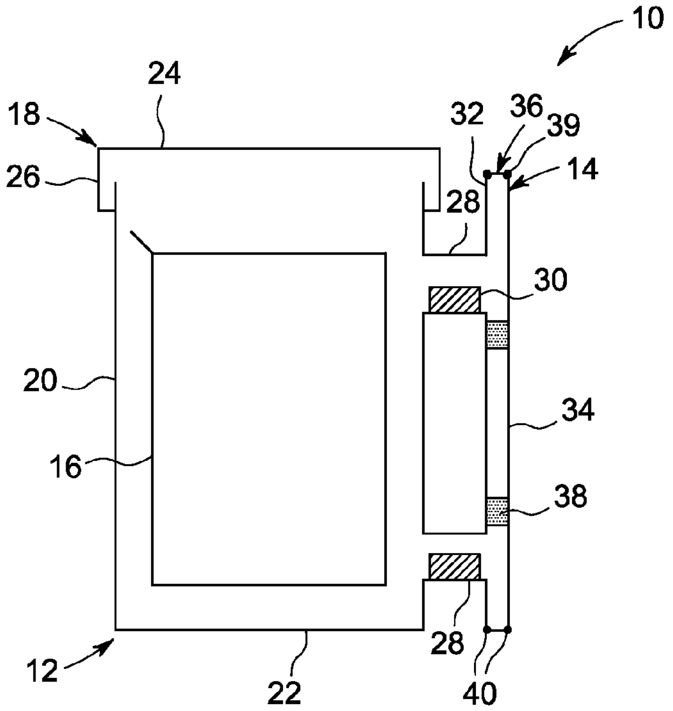
FIG. 1 illustrates an embodiment of a transformer system under normal operating conditions in accordance with aspects disclosed herein.

FIG. 1 illustrates an embodiment of a system 10 comprising a tank 12, a radiator 14, and a component 16 situated within tank 12. Component 16 is susceptible to causing a pressure increase within tank 12 when under a fault condition. In one embodiment, component 16 comprises a transformer coil and core assembly with accessories, and the tank comprises a transformer tank. Tank 12 comprises a top member 18, a sidewall member 20, and a bottom member 22. In one embodiment, top member 18 comprises a curved member having a top plate 24 and surfaces 26 extending perpendicularly from the top plate and over a portion of sidewall members 20, and top member 18 and sidewall members 20 are coupled by a joint comprising a flange extending from the sidewalls and at least one weld (not shown). As described in aforementioned U.S. patent application Ser. No. (233,687-1), top member 18, bottom member 22, or both may be connected to sidewall member 20 using joints designed to facilitate top member 18 and sidewall members 20 to flex outward to increase inner volume of tank 12 while remaining connected under increased pressure conditions.

Radiator 14 comprises an inner panel 32 and an outer panel 34 connected to the inner panel with inner panel 32 being coupled to header pipes 28. In one embodiment, inner panel 32 and outer panel 34 flex outward to increase inner volume of radiator 14 under increased pressure conditions. For example, inner panel 32 and outer panel 34 may be connected by a circumferential joint 36 that is strong enough to retain connection between the inner and outer panel when the inner panel 32 and the outer panel 34 flex outward. Spacers 38 may be attached between the inner and outer panels to maintain inner panel 32 and outer panel 34 in a spaced apart relationship.

The circumferential joint 36 comprises a joint connecting the peripheries of the inner and outer panels. In one embodiment, a stronger joint 39 is provided at the top of the radiator 14 by providing a stronger weld at the connection between the top sides of the inner panel 32 and the outer panel 34. A weaker joint 40 is formed at the bottom of the radiator 14 by providing a weaker weld at the connection between the bottom sides of the inner panel 32 and the outer panel 34. In one embodiment, a circumferential joint connection between the inner panel 32 and the outer panel 34 comprises a weaker joint 40 at the bottom of the radiator 14 so as to cause any blow out of gases and liquids to be directed downward. Specifically, the weaker joint 40 is at the connection between the bottom side of the inner and outer panels.

Radiator 14 may be connected to tank 12 by header pipes 28. In one embodiment, header pipes 28 have diameters that are larger than conventional header pipe diameters and are sized to permit sufficient flow of gas from the transformer tank to the radiator under increased pressure conditions. Under normal operating conditions, increased header pipe diameters may reduce thermal performance. In one embodiment, header pipes 28 are provided with flow restrictors 30 to control flow from tank 12 to radiator 14. Flow restrictors 30 are configured to be displaced under increased pressure conditions to increase flow from tank 12 to radiator 14. In one example, the header pipes have diameters ranging from six inches to ten inches and having cross sections of four inches when flow restrictors 30 are in place to control flow. In another embodiment, the sum of the cross-sectional areas of the header pipes is adjusted by additionally or alternatively adjusting a number of header pipes. Flow restrictors may optionally be used in this embodiment as well.

Figure 2:
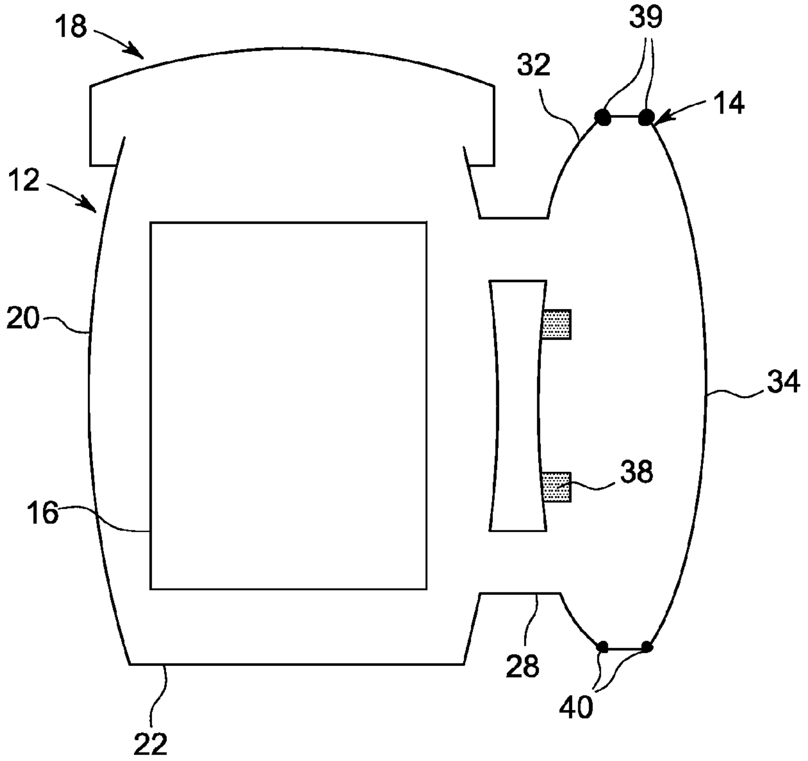
FIG. 2 illustrates an embodiment of the transformer system of FIG. 1 under increased pressure conditions in accordance with aspects disclosed herein.

FIG. 2 illustrates one embodiment of the system under increased pressure conditions. Top member 18 and sidewall members 20 flex outward to create additional volume under increased pressure conditions. Similarly, inner panel 32 and outer panel 34 of radiator 14 also flex outward to create additional volume. The flow restrictors (not shown) are displaced from header pipes 28. As inner panel 32 and outer panel 34 flex outward, spacers 38 are detached from one of the panels (shown as outer panel 34 in FIG. 3). The additional volume thus created increases the amount of gas creation and the amount of temperature increase that the tank 12 and radiator 14 can withstand without rupturing.

Figure 3:
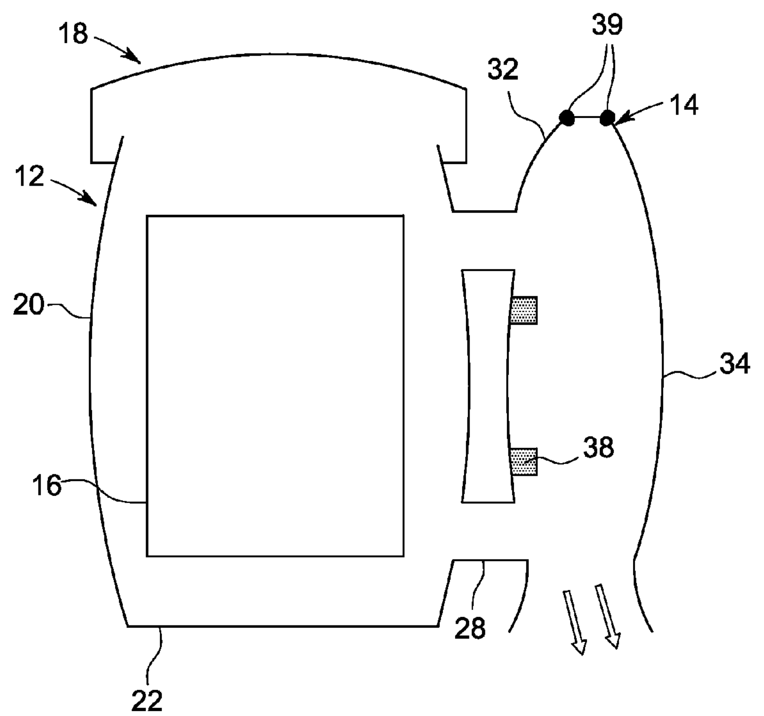
FIG. 3 illustrates an embodiment of the transformer system of FIG. 1 venting pressure under excessive pressure conditions in accordance with aspects disclosed herein.

FIG. 3 illustrates the system under excessive pressure conditions. As the pressure inside the tank 12 and the radiator 14 further increases, the weaker joint 40 fails and causes pressure to vent safely downward from the radiator joint rather than upward through the tank or radiator. The weaker joint 40 thus acts as a blowout port to provide safer pressure relief.

Figure 4:
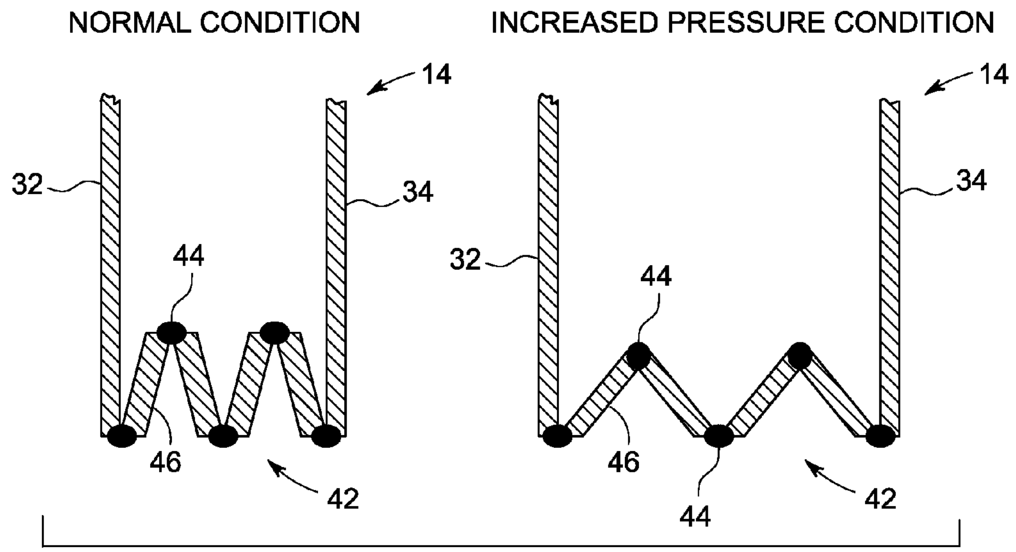
FIG. 4 illustrates an embodiment of a circumferential joint of a radiator in accordance with aspects disclosed herein.

FIG. 4 illustrates an embodiment of a circumferential joint connection 42 connecting inner panel 32 and outer panel 34 of radiator 14. Circumferential joint 42 comprises a series of interconnecting members 46 connected to the inner and outer panels by weld joints 44. Interconnecting members 46 are connected in an inclined relationship by weld joints 44. Under increased pressure conditions, interconnecting members 46 tend to spread outward. The inner panel and the outer panel also flex outward, thereby creating additional volume in the radiator. FIG. 4 shows the circumferential joint at the bottom of the radiator. Similar circumferential joint embodiments may be used for the top and sides of the radiator. Interconnecting members at the bottom of the radiator are connected by a relatively weaker weld joint, which is adapted to fail under excessive pressure conditions to vent gas and liquids.

Figure 5:
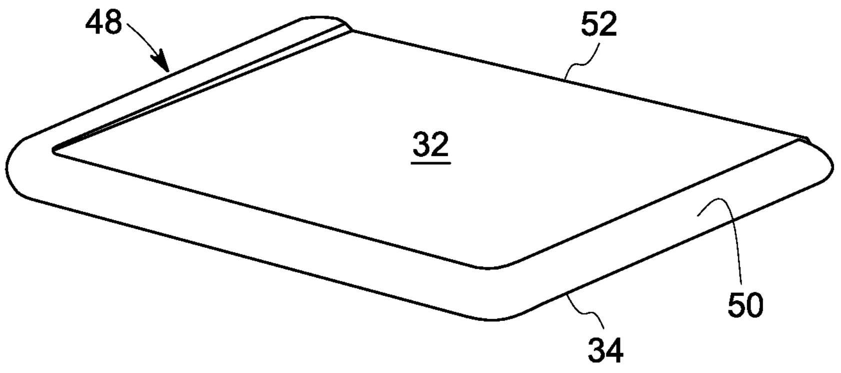
FIG. 5 illustrates another embodiment of a circumferential joint of a radiator in accordance with aspects disclosed herein.
Figure 6:
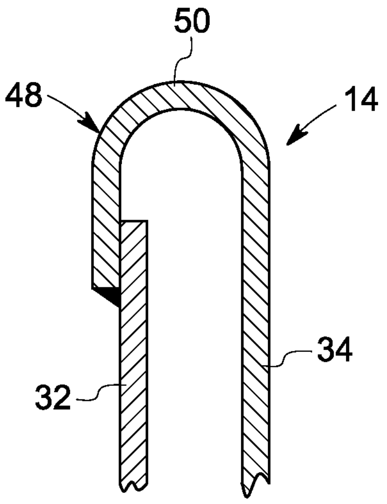
FIG. 6 illustrates a partial sectional view of the embodiment of FIG. 5.

FIGS. 5 and 6 illustrate another embodiment of a circumferential joint 48 connection between inner panel 32 and outer panel 34 of radiator 14. Circumferential joint 48 comprises an overlapping portion 50 of top, right, and left sides of outer panel 34 welded to inner panel 32 and a normal weld joint 52 connecting bottom sides of inner and outer panels. The normal weld joint 52 at the bottom sides is a weaker joint compared to the joints on top, right, and left sides of inner and outer panels. The weld joint 52 fails to vent pressure under excessive pressure conditions.

Figure 7:
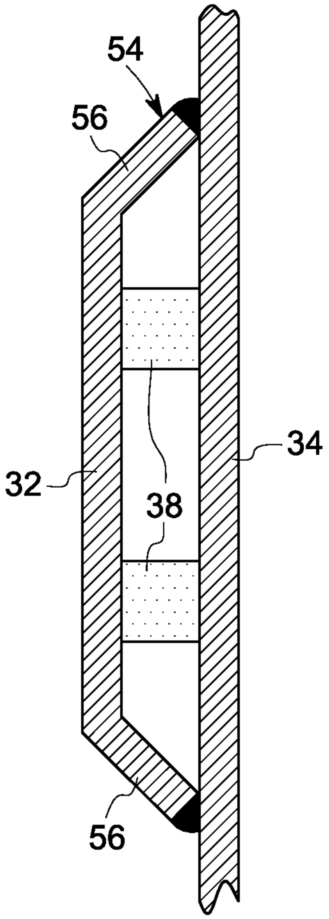
FIG. 7 illustrates another embodiment of a circumferential joint of a radiator in accordance with aspects disclosed herein.

FIG. 7 illustrates another embodiment of a circumferential joint 54 connection between inner panel 32 and outer panel 34 of radiator 14. Circumferential joint comprises a bent portion 56 of inner panel 32 that is welded to outer panel 34. In one embodiment, a stronger weld is provided on top, right, and left sides of radiator. A weaker joint is formed at bottom of radiator by providing a weaker weld at the connection between bottom sides of inner and outer panels. The weaker joint fails under excessive pressure conditions to relieve pressure.

Figure 8:
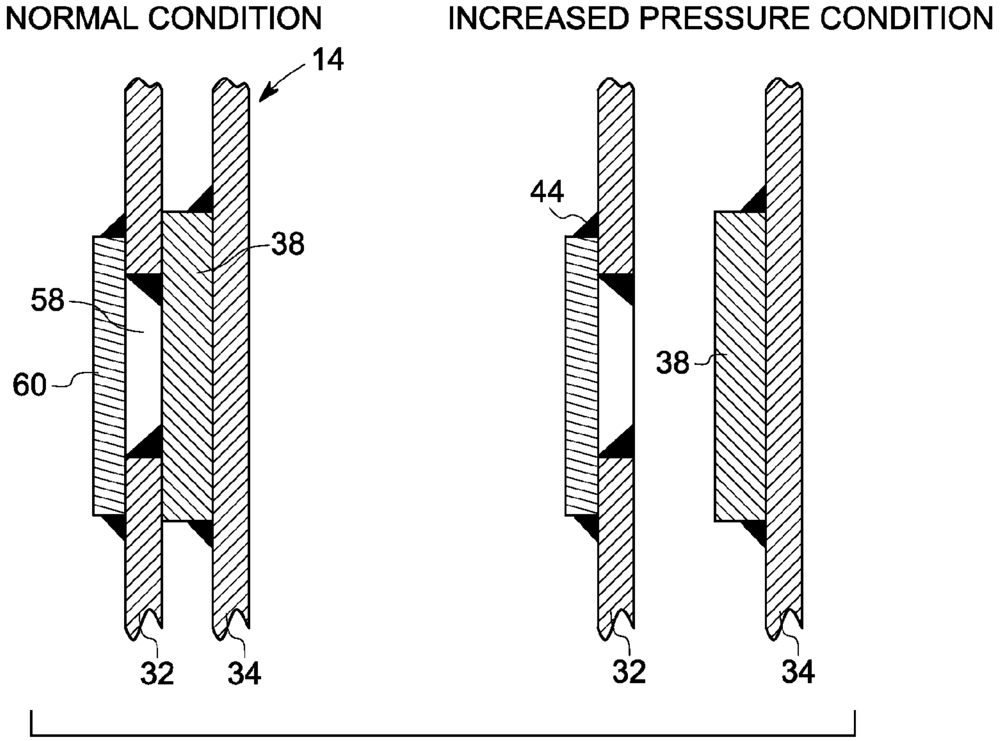
FIG. 8 illustrates an embodiment of a radiator in accordance with aspects disclosed herein.

FIG. 8 illustrates another embodiment of radiator 14 wherein inner panel 32 comprises a hole 58 for each spacer 38 to be attached. The size of spacer 38 is greater than the size of hole 58. In one embodiment, spacer 38 is initially attached to an inner surface of outer panel 34. Inner panel 32 and outer panel 34 are then connected. In this embodiment, spacer 38 is attached at a location on outer panel 34 such that it overlaps the hole 58 in the inner panel 32. A cover member 60 is attached to the outer surface of inner panel 32 to cover the hole 56. In one embodiment, weld joints 44 are used for attaching spacer 38 and cover member 60. Spacer 38 is attached such that spacer 38 detaches from inner panel 32 under increased pressure conditions. Cover member 60 keeps radiator 14 in sealed condition after spacer 38 detaches from the inner panel 32. A single spacer and hole are shown as an example. The radiator can comprise multiple spacers and holes for each spacer.

Figure 9:
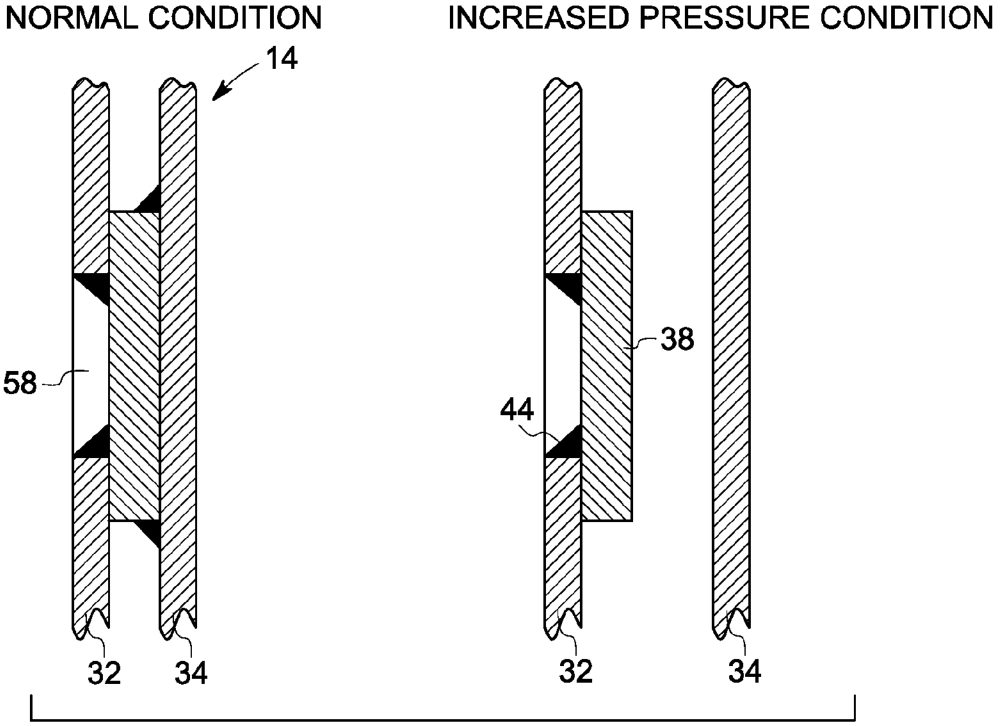
FIG. 9 illustrates another embodiment of a radiator in accordance with aspects disclosed herein.

In another embodiment as shown in FIG. 9, a cover member is not provided. In this embodiment, spacer 38 is attached in a manner so that that spacer 38 detaches from the outer panel 34 under increased pressure conditions. Therefore, spacer 38 keeps radiator 14 in sealed condition after detaching from outer panel 34.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:

a tank;

a radiator connected to the tank, the radiator comprising:

a first panel;

a second panel connected to the first panel, wherein the first and second panels surround a radiator chamber; and a component situated within the tank and susceptible to causing increasing pressure within the system when under a fault condition;

wherein the first panel and the second panel of the radiator are configured to flex outward to increase an inner volume of the radiator chamber before directionally venting pressure out of the system directly from the radiator chamber under excessive pressure conditions.

2. The system of claim 1, wherein the component comprises a transformer.

3. The system of claim 1, wherein the radiator comprises a weaker joint configured to fail to provide the directional venting of the pressure under excessive pressure conditions.

4. The system of claim 3, wherein the weaker joint is located at a bottom of the radiator.

5. The system of claim 1, wherein a connection between the first panel and the second panel comprises a weaker joint configured to vent pressure under excessive pressure conditions, wherein the weaker joint is formed by providing a weaker weld at the connection between the first panel and the second panel.

6. The system of claim 5, wherein the weaker joint is at the connection between bottom portions of the first panel and the second panel.

7. The system of claim 1, wherein the radiator is connected to the tank by a header pipe configured to permit additional flow of gas from the tank to the radiator under increased pressure conditions.

8. The system of claim 1, wherein the radiator is configured to vent a fluid axially downward under excessive pressure conditions.

9. A transformer system, comprising:

a transformer;

a transformer tank housing the transformer;

a radiator comprising:

a wall extending around an inner volume, wherein the wall comprises: a first panel and second panel connected to the first panel, wherein the first panel and the second panel are configured to flex outward to increase an inner volume of the radiator before directionally venting gases and liquids out of the system through the wall of the radiator under excessive pressure conditions; and a header pipe connecting the radiator and the transformer tank.

10. The system of claim 9, wherein the first panel is coupled to the header pipe.

11. The system of claim 10, wherein top and side edges of the first panel and the second panel are connected with a stronger joint and bottom edges of the first panel and the second panel are connected to with a weaker joint to relieve pressure under excessive pressure conditions, wherein the weaker joint is formed by providing a weaker weld at the connection between the first panel and the second panel.

12. The transformer system of claim 9, wherein the header pipe is configured to permit additional flow of gas from the transformer tank to the radiator under increased pressure conditions.

13. The system of claim 12, wherein the header pipe comprises a flow restrictor to control flow from transformer tank to the radiator under normal operating conditions.

14. The system of claim 9, wherein the transformer tank comprises a top lid member, a side wall, and a bottom member, and wherein at least one of the top, sidewall, and bottom members is connected to another of the top, sidewall, and bottom members in a manner so as to cause an increase in inner volume of the tank under increased pressure conditions.

* * * * *